US011637095B2

(12) United States Patent
Choi et al.

(10) Patent No.: US 11,637,095 B2
(45) Date of Patent: Apr. 25, 2023

(54) THREE-DIMENSIONAL SEMICONDUCTOR MEMORY DEVICE

(71) Applicant: SK hynix Inc., Icheon-si (KR)

(72) Inventors: Seong Ho Choi, Icheon-si (KR); Jin Ho Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 140 days.

(21) Appl. No.: 17/155,600

(22) Filed: Jan. 22, 2021

(65) Prior Publication Data

US 2022/0077126 A1 Mar. 10, 2022

(30) Foreign Application Priority Data

Sep. 8, 2020 (KR) .................. 10-2020-0114975

(51) Int. Cl.
*H01L 25/18* (2006.01)
*G11C 16/08* (2006.01)
*H01L 23/00* (2006.01)
*H01L 25/065* (2006.01)
*H01L 27/11556* (2017.01)
*H01L 27/11582* (2017.01)

(52) U.S. Cl.
CPC .............. *H01L 25/18* (2013.01); *G11C 16/08* (2013.01); *H01L 24/08* (2013.01); *H01L 25/0657* (2013.01); *H01L 27/11556* (2013.01); *H01L 27/11582* (2013.01); *H01L 2224/08145* (2013.01); *H01L 2924/1431* (2013.01); *H01L 2924/14511* (2013.01)

(58) Field of Classification Search
CPC ..... H01L 25/18; H01L 24/08; H01L 25/0657; H01L 27/11556; H01L 27/11582; H01L 2224/08145; H01L 2924/1431; H01L 2924/14511; G11C 16/08
See application file for complete search history.

(56) References Cited

U.S. PATENT DOCUMENTS

2020/0006377 A1* 1/2020 Chu ....................... H01L 23/528
2020/0098748 A1 3/2020 Xiao et al.
2021/0375848 A1* 12/2021 Zhou ....................... H01L 24/08

FOREIGN PATENT DOCUMENTS

KR 1020190051316 A 5/2019

* cited by examiner

*Primary Examiner* — Benjamin Tzu-Hung Liu

(57) ABSTRACT

A three-dimensional semiconductor memory device may include a cell wafer including a source plate, a plurality of first word lines stacked to be spaced apart from one another along a plurality of first vertical channels projecting from a bottom surface of the source plate in a vertical direction, and a plurality of second word lines stacked to be spaced apart from one another along a plurality of second vertical channels projecting from a top surface of the source plate in a vertical direction; a first peripheral wafer bonded to a bottom surface of the cell wafer, and including a first row decoder unit which transfers an operating voltage to the plurality of first word lines; and a second peripheral wafer bonded to a top surface of the cell wafer, and including a second row decoder unit which transfers an operating voltage to the plurality of second word lines.

15 Claims, 10 Drawing Sheets

THREE-DIMENSIONAL SEMICONDUCTOR MEMORY DEVICE

CROSS-REFERENCE TO RELATED APPLICATION

The present application claims priority under 35 U.S.C. § 119(a) to Korean Patent Application No. 10-2020-0114975 filed in the Korean Intellectual Property Office on Sep. 8, 2020, which is incorporated herein by reference in its entirety.

BACKGROUND

1. Technical Field

Various embodiments generally relate to a semiconductor technology, and more particularly, to a three-dimensional semiconductor memory device.

2. Related Art

A semiconductor memory device with a two-dimensional or planar structure has been developed to store more data in the same area by using a fine patterning process. However, as the line width of a circuit is narrowed due to the demand for high integration, interference between memory cells becomes severe, thereby causing various limitations such as degradation in performance. Of course, in addition to such structural limitations, there is a problem in that an increase in manufacturing cost is inevitable because the introduction of expensive equipment is required to pattern a fine line width.

As an alternative to overcome such limitations of the two-dimensional semiconductor memory device, a three-dimensional semiconductor memory device has been proposed. The three-dimensional semiconductor memory device has advantages in that a larger capacity may be realized within the same area by increasing the number of stacks through stacking memory cells in a vertical direction, thereby providing high performance and excellent power efficiency.

SUMMARY

Various embodiments are directed to a three-dimensional semiconductor memory device with improved degrees of integration and performance.

In an embodiment, a three-dimensional semiconductor memory device may include: a cell wafer including a source plate, a plurality of first word lines stacked to be spaced apart from one another along a plurality of first vertical channels projecting from a bottom surface of the source plate in a vertical direction, and a plurality of second word lines stacked to be spaced apart from one another along a plurality of second vertical channels projecting from a top surface of the source plate in the vertical direction; a first peripheral wafer bonded to a bottom surface of the cell wafer, and including a first row decoder unit, which transfers an operating voltage to the plurality of first word lines; and a second peripheral wafer bonded to a top surface of the cell wafer, and including a second row decoder unit, which transfers an operating voltage to the plurality of second word lines.

In an embodiment, a three-dimensional semiconductor memory device may include: a cell wafer including a source plate, a first memory block including a plurality of first cell strings, which extend in a vertical direction from a bottom surface of the source plate, and a second memory block including a plurality of second cell strings, which extend in the vertical direction from a top surface of the source plate; a first peripheral wafer bonded to a bottom surface of the cell wafer, and including a first row decoder unit, which transfers an operating voltage to the first memory block; and a second peripheral wafer bonded to a top surface of the cell wafer, and including a second row decoder unit, which transfers an operating voltage to the second memory block. The first memory block and the second memory block may be configured to be erased independently of each other.

In an embodiment, a three-dimensional semiconductor memory device may include: a cell wafer including a source plate, a first sub memory cell array that is disposed under the source plate, and a second sub memory cell array that is disposed on the source plate; a first peripheral wafer bonded to a bottom surface of the cell wafer, and including a first logic circuit unit, which transfers an operating voltage to the first sub memory cell array; and a second peripheral wafer bonded to a top surface of the cell wafer, and including a second logic circuit unit, which transfers an operating voltage to the second sub memory cell array.

DETAILED DESCRIPTION

Figure 1:
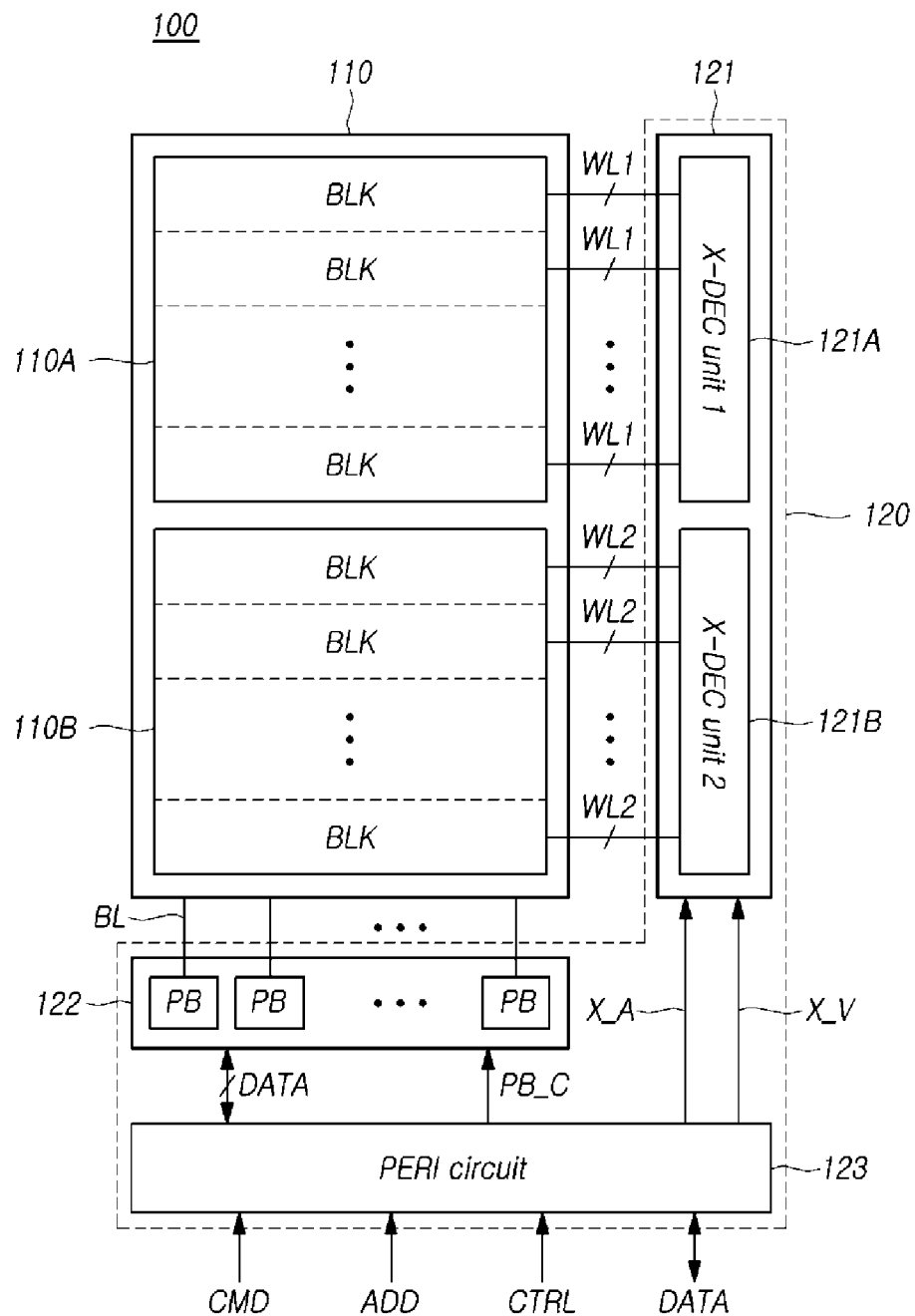
FIG. 1 is a block diagram schematically illustrating a representation of a semiconductor memory device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

Because the figures, dimensions, ratios, angles, numbers of elements given in the drawings that describe embodiments of the disclosure are merely illustrative, the present disclosure is not limited to the illustrated matters. Throughout the specification, like reference numerals refer to like components. In describing the disclosure, when it is determined that a detailed description of the related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article (e.g., "a," "an" or "the") is used when referring to a singular noun, the article may include a plural of that noun unless specifically stated otherwise.

In interpreting elements in embodiments of the disclosure, they should be interpreted as including error margins even in the absence of explicit statements.

Also, in describing the components of the disclosure, there may be used terms such as first, second, A, B, (a), and (b). These are solely for the purpose of differentiating one component from another component and do not limit the substances, order, sequence or number of the components. Also, components in embodiments of the disclosure are not limited by these terms. These terms are used to merely distinguish one component from another component. Accordingly, as used herein, a first component may be a second component within the technical spirit of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element B" and "an element A next to an element B," one or more other elements may be disposed between the elements A and B unless the term "directly" or "immediately" is explicitly used.

Features of various exemplary embodiments of the disclosure may be coupled, combined or separated partially or totally. Technically various interactions and operations are possible. Various exemplary embodiments can be practiced individually or in combination.

Hereinafter, various examples of embodiments of the disclosure will be described in detail with reference to the accompanying drawings.

FIG. 1 is a block diagram schematically illustrating a representation of a semiconductor memory device in accordance with an embodiment of the disclosure.

Referring to FIG. 1, a semiconductor memory device 100 in accordance with an embodiment of the disclosure may include a memory cell array 110 and a logic circuit 120. The logic circuit 120 may include a row decoder (X-DEC) 121, a page buffer circuit 122 and a peripheral circuit (PERI circuit) 123.

The memory cell array 110 may include a first sub memory cell array 110A and a second sub memory cell array 110B. Each of the first sub memory cell array 110A and the second sub memory cell array 110B may include a plurality of memory blocks BLK.

The memory block BLK may include a plurality of memory cells. For example, the memory cells may be nonvolatile memory cells, and, in more detail, the memory cells may be nonvolatile memory cells based on a charge trap device.

Each of the memory blocks BLK of the first sub memory cell array 110A may be coupled to the row decoder 121 through a plurality of first word lines WL1. Each of the memory blocks BLK of the second sub memory cell array 110B may be coupled to the row decoder 121 through a plurality of second word lines WL2.

The row decoder 121 may select any one from among the memory blocks BLK included in the first sub memory cell array 110A and the memory blocks BLK included in the second sub memory cell array 110B, in response to a row address X_A provided from the peripheral circuit 123.

The row decoder 121 may include a first row decoder unit 121A, which is coupled to the first sub memory cell array 110A through the plurality of first word lines WL1, and a second row decoder unit 121B, which is coupled to the second sub memory cell array 110B through the plurality of second word lines WL2.

The first row decoder unit 121A may transfer an operating voltage X_V, provided from the peripheral circuit 123, to first word lines WL1 coupled to a memory block BLK selected from among the memory blocks BLK included in the first sub memory cell array 110A. The second row decoder unit 121B may transfer the operating voltage X_V, provided from the peripheral circuit 123, to second word lines WL2 coupled to a memory block BLK selected from among the memory blocks BLK included in the second sub memory cell array 110B. Although not illustrated, in order to transfer the operating voltage X_V, each of the first row decoder unit 121A and the second row decoder unit 121B may include a plurality of pass transistors.

The page buffer circuit 122 may include a plurality of page buffers PB, which are coupled to the memory cell array 110 through a plurality of bit lines BL.

The page buffer PB may receive a page buffer control signal PB_C from the peripheral circuit 123, and may transmit and receive a data signal DATA to and from the peripheral circuit 123. The page buffer PB may control the bit lines BL in response to the page buffer control signals PB_C. For example, the page buffer PB may detect data, stored in a memory cell of the memory cell array 110, by sensing the signal of a bit line BL in response to the page buffer control signal PB_C, and may transmit the data signal DATA to the peripheral circuit 123 depending on the detected data. The page buffer PB may apply a signal to a bit line BL, based on the data signal DATA received from the peripheral circuit 123, in response to the page buffer control signal PB_C, and thereby, may write data to a memory cell of the memory cell array 110. The page buffer PB may write or read data to or from a memory cell, which is coupled to an activated word line.

The peripheral circuit 123 may receive a command signal CMD, an address signal ADD and a control signal CTRL from a device outside the semiconductor memory device 100, for example, a memory controller, and may transmit and receive data DATA to and from the device outside the semiconductor memory device 100. The peripheral circuit 123 may output signals for writing data to the memory cell array 110 or reading data from the memory cell array 110, for example, the row address X_A, the page buffer control signal PB_C and so forth, based on the command signal CMD, the address signal ADD and the control signal CTRL. The peripheral circuit 123 may generate various voltages including the operating voltage X_V, which are required in the semiconductor memory device 100.

As the size of an electronic product (in particular, a mobile product) in which the semiconductor memory device 100 is mounted decreases, reducing the size of the semiconductor memory device 100 is continuously demanded. As the stack number of word lines increases due to a demand for high capacity, the number of pass transistors included in the row decoder 121 is increasing, and thus, the occupation area of the row decoder 121 is increasing. For this reason, it is difficult to fabricate the semiconductor memory device 100 to a small size.

Embodiments of the disclosure may suggest measures capable of suppressing an increase in the size of the semiconductor memory device 100 and improving the degree of integration.

Hereinbelow, in the accompanying drawings, a direction vertically projecting from the top surface of a substrate is defined as a vertical direction VD, and two directions parallel to the top surface of the substrate and intersecting with each other are defined as a first direction FD and a second direction SD, respectively. For example, the first direction FD may correspond to the extending direction of word lines or/and the arrangement direction of bit lines, and the second direction SD may correspond to the extending direction of the bit lines or/and the arrangement direction of the word lines. The first direction FD and the second direction SD may substantially perpendicularly intersect with each other. In the drawings, a direction indicated by an arrow and a direction opposite thereto represent the same direction.

Figure 2:
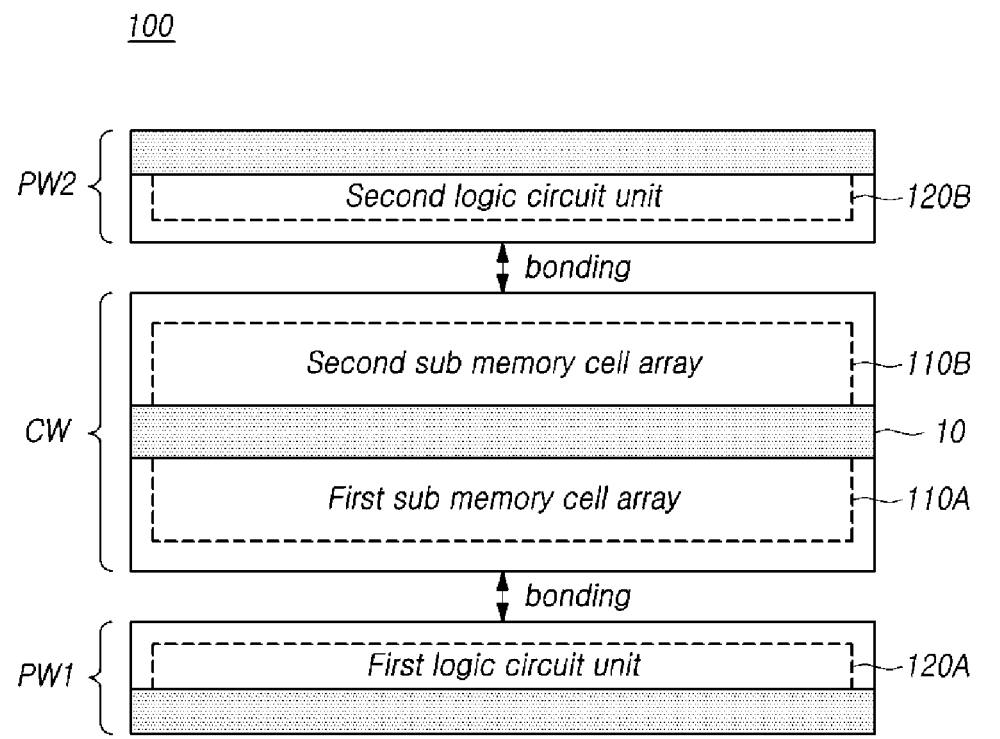
FIG. 2 is a schematic cross-sectional view illustrating a representation of a semiconductor memory device in accordance with an embodiment of the disclosure.

FIG. 2 is a schematic cross-sectional view illustrating a representation of a semiconductor memory device in accordance with an embodiment of the disclosure.

Referring to FIG. 2, a semiconductor memory device 100 in accordance with an embodiment of the disclosure may include a cell wafer CW, and a first peripheral wafer PW1 and a second peripheral wafer PW2, which are bonded to the bottom surface and the top surface of the cell wafer CW by a bonding technique, such as for example, hybrid bonding.

The semiconductor memory device 100 may be a non-monolithic three-dimensional memory device. The term non-monolithic means that the cell wafer CW, the first peripheral wafer PW1 and the second peripheral wafer PW2, which configure the semiconductor memory device 100, are separately fabricated on different substrates and are then coupled to one another by a bonding technique.

Figure 3:
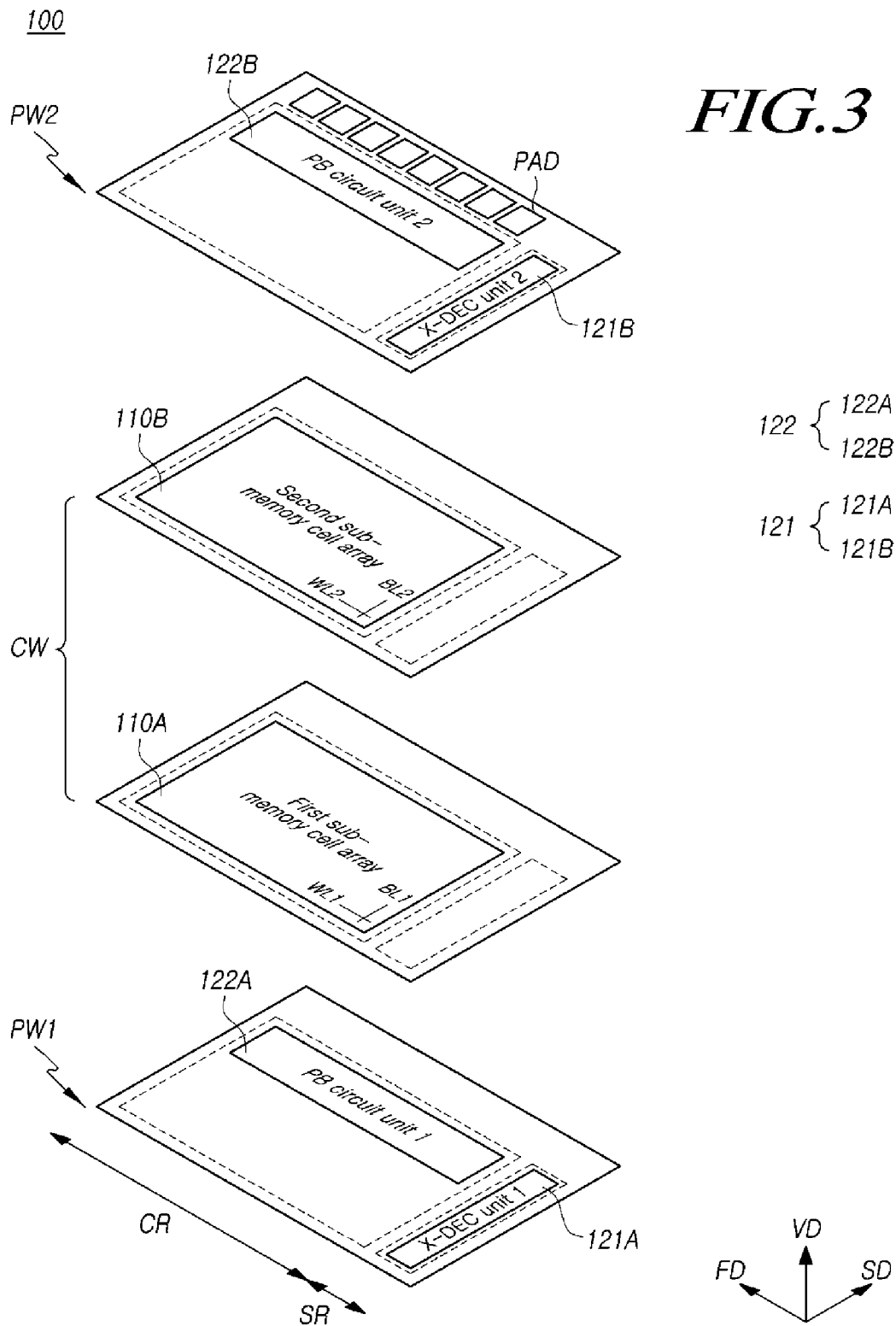
FIG. 3 is a view illustrating a representation of a schematic layout of a semiconductor memory device in accordance with an embodiment of the disclosure.
Figure 5:
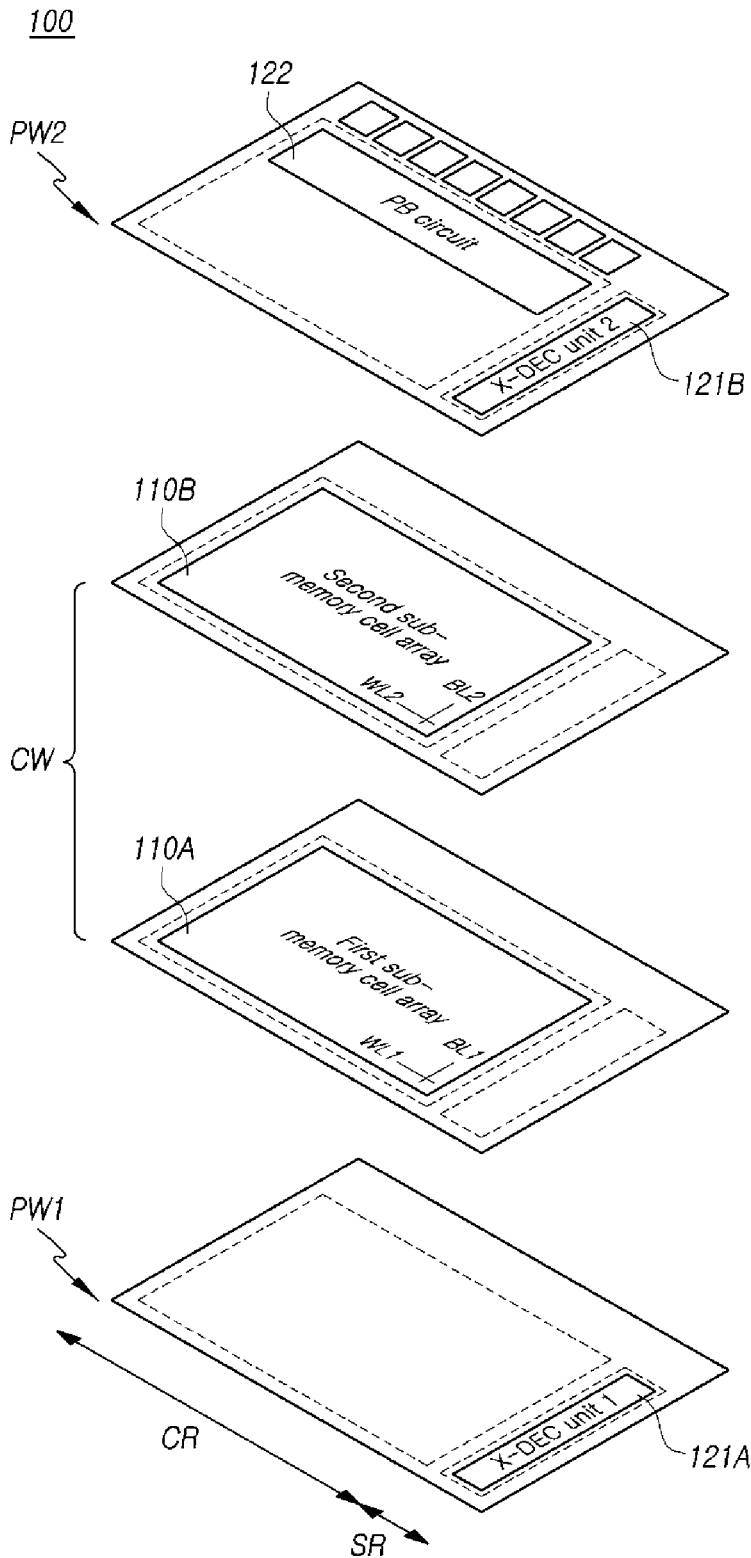
FIG. 5 is a view illustrating a representation of a schematic layout of a semiconductor memory device in accordance with another embodiment of the disclosure.

In order to facilitate understanding, FIGS. 2, 3 and 5 illustrates that the bottom surface of the cell wafer CW and the top surface of the first peripheral wafer PW1 are separated from each other and the top surface of the cell wafer CW and the bottom surface of the second peripheral wafer PW2 are separated from each other. However, it should be understood that the bottom surface of the cell wafer CW and the top surface of the first peripheral wafer PW1 are in contact with each other, and the top surface of the cell wafer CW and the bottom surface of the second peripheral wafer PW2 are in contact with each other.

A first sub memory cell array 110A may be disposed on the bottom surface of a source plate 10 of the cell wafer CW, and a second sub memory cell array 110B may be disposed on the top surface of the source plate 10 of the cell wafer CW. The cell wafer CW may be a dual side memory, which includes the first sub memory cell array 110A and the second sub memory cell array 110B disposed on both surfaces of the source plate 10.

A logic circuit 120 may be divided into a first logic circuit unit 120A and a second logic circuit unit 120B, and may be disposed in the first peripheral wafer PW1 and the second peripheral wafer PW2, respectively.

FIG. 3 is a view illustrating a representation of a schematic layout of a semiconductor memory device in accordance with an embodiment of the disclosure.

Referring to FIG. 3, a cell region CR and a slimming region SR may be defined in the first direction FD.

A first sub memory cell array 110A and a second sub memory cell array 110B may be disposed in the cell region CR of a cell wafer CW to overlap with each other in the vertical direction VD.

A plurality of first word lines WL1 and a plurality of first bit lines BL1, which are coupled to the first sub memory cell array 110A, may be provided on one side of the cell wafer CW. The plurality of first word lines WL1 may extend in the first direction FD and be arranged in the second direction SD, and the plurality of first bit lines BL1 may extend in the second direction SD and be arranged in the first direction FD.

A plurality of second word lines WL2 and a plurality of second bit lines BL2, which are coupled to the second sub memory cell array 110B, may be provided on the other side of the cell wafer CW. The plurality of second word lines WL2 may extend in the first direction FD and be arranged in the second direction SD, and the plurality of second bit lines BL2 may extend in the second direction SD and be arranged in the first direction FD.

A first row decoder unit (X-DEC unit 1) 121A may be disposed in the slimming region SR of a first peripheral wafer PW1. In order to reduce a delay of a signal provided to the first word lines WL1 from the first row decoder unit 121A, the first row decoder unit 121A may be disposed to have a shape extending in the second direction SD as a direction in which the first word lines WL1 are arranged, and may have a length substantially the same as or similar to the first sub memory cell array 110A in the second direction SD.

A second row decoder unit (X-DEC unit 2) 121B may be disposed in the slimming region SR of a second peripheral wafer PW2, and may overlap with the first row decoder unit 121A in the vertical direction VD.

Similarly to the first row decoder unit 121A, the second row decoder unit 121B may be disposed to have a shape extending in the second direction SD as a direction in which the second word lines WL2 are arranged, and may have a length substantially the same as or similar to the second sub memory cell array 110B in the second direction SD.

A page buffer circuit 122 may include a first page buffer circuit unit (PB circuit unit 1) 122A and a second page buffer circuit unit (PB circuit unit 2) 122B.

The first page buffer circuit unit 122A may be disposed in the cell region CR of the first peripheral wafer PW1, and may include a plurality of page buffers (not illustrated), which are coupled to the plurality of first bit lines BL1, respectively. In order to reduce a delay of a signal applied to the first bit lines BL1 from the first page buffer circuit unit 122A, or a signal received in the first page buffer circuit unit 122A from the first bit lines BL1, the first page buffer circuit unit 122A may be disposed to have a shape extending in the first direction FD as a direction in which the first bit lines BL1 are arranged, and may have a length substantially the same as or similar to the first sub memory cell array 110A in the first direction FD.

The second page buffer circuit unit 122B may be disposed in the cell region CR of the second peripheral wafer PW2, and may overlap with the first page buffer circuit unit 122A in the vertical direction VD. The second page buffer circuit unit 122B may include a plurality of page buffers (not illustrated), which are coupled to the plurality of second bit lines BL2, respectively.

Similarly to the first page buffer circuit unit 122A, the second page buffer circuit unit 122B may be disposed to have a shape extending in the first direction FD as a direction in which the second bit lines BL2 are arranged, and may have a length substantially the same as or similar to the second sub memory cell array 110B in the first direction FD.

Although not illustrated, a peripheral circuit (123 of FIG. 1) may be disposed in the first peripheral wafer PW1 and/or in the second peripheral wafer PW2. For example, the peripheral circuit may be disposed in a region where the first row decoder unit 121A and the first page buffer circuit unit 122A are not disposed in the first peripheral wafer PW1 and in a region where the second row decoder unit 121B and the second page buffer circuit unit 122B are not disposed in the second peripheral wafer PW2.

The first row decoder unit 121A, the first page buffer circuit unit 122A and one part (not illustrated) of the peripheral circuit, which are disposed in the first peripheral wafer PW1, may configure a first logic circuit unit (120A of FIG. 2). The second row decoder unit 121B, the second page buffer circuit unit 122B and the other part (not illustrated) of the peripheral circuit, which are disposed in the second peripheral wafer PW2, may configure a second logic circuit unit (120B of FIG. 2).

A plurality of external coupling pads PAD may be disposed in a line at one edge of the second peripheral wafer PW2. Through the plurality of external coupling pads PAD, a semiconductor memory device 100 may receive electrical signals (e.g., a command signal, an address signal and a control signal) from an external device, such as for example, a memory controller, and may exchange data with the external device. The semiconductor memory device 100 may be provided with a power supply voltage from the outside through at least one external coupling pad PAD.

Figure 4:
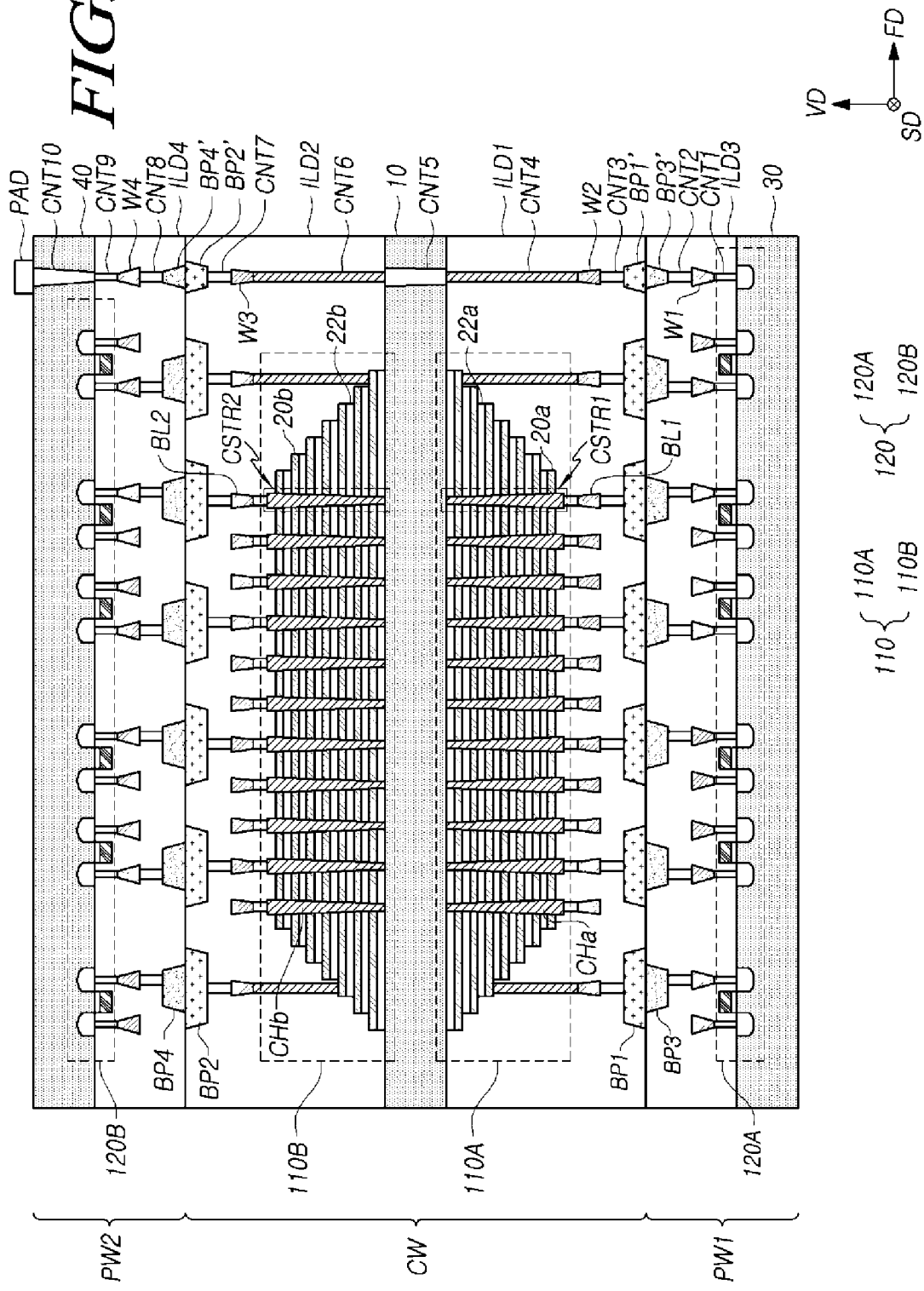
FIG. 4 is a cross-sectional view illustrating a representation of the semiconductor memory device illustrated in FIG. 3.

FIG. 4 is a cross-sectional view illustrating a representation of the semiconductor memory device illustrated in FIG. 3.

Referring to FIG. 4, a source plate 10 may include a semiconductor material, for example, silicon (Si), germanium (Ge), silicon germanium (SiGe) or gallium arsenide (GaAs).

The first sub memory cell array 110A may include a plurality of first vertical channels CHa, which project in the vertical direction VD from the bottom surface of the source plate 10, and a plurality of first electrode layers 20a and a plurality of first interlayer dielectric layers 22a that are alternately stacked on the bottom surface of the source plate 10 and along the plurality of first vertical channels CHa.

The first electrode layers 20a may include a conductive material. For example, the first electrode layers 20a may include at least one selected from among a doped semiconductor (e.g., doped silicon), a metal (e.g., tungsten, copper or aluminum), a conductive metal nitride (e.g., titanium nitride or tantalum nitride) and a transition metal (e.g., titanium or tantalum). The first interlayer dielectric layers 22a may include silicon oxide.

Among the first electrode layers 20a, at least one first electrode layer 20a from the uppermost first electrode layer 20a may configure a source select line. Among the first electrode layers 20a, at least one first electrode layer 20a from the lowermost first electrode layers 20a may configure a drain select line. The first electrode layers 20a between the source select line and the drain select line may configure first word lines.

While not illustrated in detail, each of the first vertical channels CHa may include a channel layer and a gate dielectric layer. The channel layer may include polysilicon or monocrystalline silicon, and may include, in some regions thereof, a p-type impurity such as boron (B). The gate dielectric layer may have a shape which surrounds the outer wall of the channel layer. The gate dielectric layer may include a tunnel dielectric layer, a charge storage layer and a blocking layer, which are sequentially stacked from the outer wall of the channel layer. In some embodiments, the gate dielectric layer may have an ONO (oxide-nitride-oxide) stack structure in which an oxide layer, a nitride layer and an oxide layer are sequentially stacked.

A source select transistor may be configured in areas or regions where the source select line surrounds the first vertical channel CHa. Memory cells may be configured in areas or regions where the first word lines surround the first vertical channel CHa. A drain select transistor may be configured in areas or regions where the drain select line surrounds the first vertical channel CHa.

A source select transistor, a plurality of memory cells and a drain select transistor, which are disposed along one first vertical channel CHa in the vertical direction VD, may configure one first cell string CSTR1. The first sub memory cell array 110A may include a plurality of first cell strings CSTR1 corresponding to the plurality of first vertical channels CHa.

The plurality of first bit lines BL1 may be disposed below the first vertical channels CHa. Each of the first bit lines BL1 may be coupled to a corresponding first vertical channel CHa through a contact.

A dielectric layer ILD1 may be defined on the bottom surface of the source plate 10 to cover the plurality of first electrode layers 20a, the plurality of first interlayer dielectric layers 22a, the plurality of first vertical channels CHa and the plurality of first bit lines BL1. The bottom surface of the dielectric layer ILD1 may configure the bottom surface of the cell wafer CW, which is bonded to the first peripheral wafer PW1. The cell wafer CW may include, on the bottom surface thereof, a plurality of first bonding pads BP1, which are coupled to the plurality of first electrode layers 20a and the plurality of first bit lines BL1.

For the sake of simplicity in illustration, FIG. 4 illustrates only some of a plurality of first bonding pads BP1, which are coupled to some of the first electrode layers 20a and to some of the first bit lines BL1. However, it should be understood that a plurality of first bonding pads BP1 are coupled to the plurality of first electrode layers 20a and to the plurality of first bit lines BL1, respectively.

Similarly to the first sub memory cell array 110A, the second sub memory cell array 110B may include a plurality of second vertical channels CHb, which project in the vertical direction VD from the top surface of the source plate 10, and a plurality of second electrode layers 20b and a plurality of second interlayer dielectric layers 22b, which are alternately stacked on the top surface of the source plate 10 and along the plurality of second vertical channels CHb. For example, the second sub memory cell array 110B may have a structure that is a symmetrical, mirror image of the structure of first sub memory cell array 110A with respect to the source plate 10.

Among the second electrode layers 20b, at least one second electrode layer 20b from the lowermost second electrode layers 20b may configure a source select line.

Among the second electrode layers 20b, at least one second electrode layer 20b from the uppermost second electrode layer 20b may configure a drain select line. The second electrode layers 20b between the source select line and the drain select line may configure second word lines.

A source select transistor may be configured in areas or regions where the source select line surrounds the second vertical channel CHb. Memory cells may be configured in areas or regions where the second word lines surround the second vertical channel CHb. A drain select transistor may be configured in areas or regions where the drain select line surrounds the second vertical channel CHb.

A source select transistor, a plurality of memory cells and a drain select transistor, which are disposed along one second vertical channel CHb in the vertical direction VD, may configure one second cell string CSTR2. The second sub memory cell array 110B may include a plurality of second cell strings CSTR2 corresponding to the plurality of second vertical channels CHb.

The plurality of second bit lines BL2 may be disposed over the second vertical channels CHb. Each of the second bit lines BL2 may be coupled to a corresponding second vertical channel CHb through a contact.

A dielectric layer ILD2 may be defined on the top surface of the source plate 10 to cover the plurality of second electrode layers 20b, the plurality of second interlayer dielectric layers 22b, the plurality of second vertical channels CHb and the plurality of second bit lines BL2. The top surface of the dielectric layer ILD2 may configure the top surface of the cell wafer CW, which is bonded to the second peripheral wafer PW2. The cell wafer CW may include, on the top surface thereof, a plurality of second bonding pads BP2, which are coupled to the plurality of second electrode layers 20b and the plurality of second bit lines BL2. For the sake of simplicity in illustration, FIG. 4 illustrates only some of a plurality of second bonding pads BP2, which are coupled to some of the second electrode layers 20b and to some of the second bit lines BL2. However, it should be understood that the plurality of second bonding pads BP2 are coupled to the plurality of second electrode layers 20b and the plurality of second bit lines BL2, respectively.

The first peripheral wafer PW1 may include a substrate 30 and a first logic circuit unit 120A, which is defined on the substrate 30, and the second peripheral wafer PW2 may include a substrate 40 and a second logic circuit unit 120B, which is defined under the substrate 40. The first logic circuit unit 120A and the second logic circuit unit 120B may be fabricated using a CMOS (complementary metal oxide semiconductor) technology.

A dielectric layer ILD3 may be defined on the top surface of the substrate 30 of the first peripheral wafer PW1 to cover the first logic circuit unit 120A. The top surface of the dielectric layer ILD3 may configure the top surface of the first peripheral wafer PW1, which is bonded to the cell wafer CW. The first peripheral wafer PW1 may include, on the top surface thereof, a plurality of third bonding pads BP3, which are coupled to the first logic circuit unit 120A. The first sub memory cell array 110A and the first logic circuit unit 120A may be electrically coupled through the plurality of third bonding pads BP3 respectively bonded to the plurality of first bonding pads BP1.

A dielectric layer ILD4 may be defined on the bottom surface of the substrate 40 of the second peripheral wafer PW2 to cover the second logic circuit unit 120B. The bottom surface of the dielectric layer ILD4 may configure the bottom surface of the second peripheral wafer PW2, which is bonded to the cell wafer CW. The second peripheral wafer PW2 may include, on the bottom surface thereof, a plurality of fourth bonding pads BP4, which are coupled to the second logic circuit unit 120B. The second sub memory cell array 110B and the second logic circuit unit 120B may be electrically coupled by the plurality of fourth bonding pads BP4 respectively bonded to the plurality of second bonding pads BP2.

As described above with reference to FIGS. 1 to 3, the first row decoder unit 121A, which is coupled to the first word lines WL1 of the first sub memory cell array 110A, is disposed in the first peripheral wafer PW1, and the second row decoder unit 121B, which is coupled to the second word lines WL2 of the second sub memory cell array 110B, is disposed in the second peripheral wafer PW2. Thus, bonding pads that couple the first word lines WL1 and the first row decoder unit 121A (see FIG. 3) are disposed at the bonding surface between the cell wafer CW and the first peripheral wafer PW1, and bonding pads that couple the second word lines WL2 and the second row decoder unit 121B (see FIG. 3) are disposed at the bonding surface between the cell wafer CW and the second peripheral wafer PW2. That is to say, bonding pads that couple the word lines WL1 and WL2 and a row decoder 121 (see FIG. 3) are distributed over two separate top and bottom bonding surfaces common to cell wafer CW. Therefore, compared to a case where all of the bonding pads that couple the word lines WL1 and WL2 and the row decoder 121 are disposed on one bonding surface, in embodiments disclosed herein, the number of bonding pads that are disposed on each bonding surface decreases, and thus, it is possible to increase the size of each bonding pad. As a consequence, an alignment margin during wafer bonding may be increased, which suppresses or reduces the occurrence of a pad bonding failure.

Referring again to FIG. 4, the external coupling pad PAD may be disposed on the top surface of the substrate 40 of the second peripheral wafer PW2. Although not illustrated, a dielectric layer for insulating the external coupling pad PAD and the substrate 40 may be additionally formed on the top surface of the substrate 40. The external coupling pad PAD may be coupled to at least one of the first logic circuit unit 120A and the second logic circuit unit 120B.

To facilitate the electrical coupling between the external coupling pad PAD and the first logic circuit unit 120A, each of the first and second peripheral wafers PW1 and PW2 and the cell wafer CW may have a vertical coupling structure.

The vertical coupling structure of the first peripheral wafer PW1 may include a plurality of contacts CNT1 and CNT2, a wiring line W1 and a bonding pad BP3', which may be disposed in the vertical direction VD. For example, the bonding pad BP3' may be disposed on the top surface of the first peripheral wafer PW1, and the plurality of contacts CNT1 and CNT2 and the wiring line W1 may be disposed through the dielectric layer ILD3 in the vertical direction VD to couple the bonding pad BP3' and the first logic circuit unit 120A.

The vertical coupling structure of the cell wafer CW may include a plurality of contacts CNT3 to CNT7, a plurality of wiring lines W2 and W3 and bonding pads BP1' and BP2', which are disposed in the vertical direction VD. For example, the bonding pad BP1' and the bonding pad BP2' may be disposed on the bottom surface and the top surface, respectively, of the cell wafer CW, and the plurality of contacts CNT3 to CNT7 and the plurality of wiring lines W2 and W3 may be disposed through the dielectric layer ILD1, the source plate 10 and the dielectric layer ILD2 in the vertical direction VD to couple the bonding pad BP1' and the bonding pad BP2'.

The vertical coupling structure of the second peripheral wafer PW2 may include a plurality of contacts CNT8 to CNT10, a wiring line W4 and a bonding pad BP4', which are disposed in the vertical direction VD. For example, the bonding pad BP4' may be disposed on the bottom surface of the second peripheral wafer PW2, and the plurality of contacts CNT8 to CNT10 and the wiring line W4 may be disposed through the dielectric layer ILD4 and the substrate 40 in the vertical direction VD to couple the bonding pad BP4' and the external coupling pad PAD.

As the bonding pad BP3' of the first peripheral wafer PW1 and the bonding pad BP1' of the cell wafer CW are bonded to each other, and the bonding pad BP2' of the cell wafer CW and the bonding pad BP4' of the second peripheral wafer PW2 are bonded to each other, an electrical path that couples the first logic circuit unit 120A and the external coupling pad PAD may be configured.

FIG. 5 is a view illustrating a representation of a schematic layout of a semiconductor memory device in accordance with another embodiment of the disclosure.

Referring to FIG. 5, a page buffer circuit (PB circuit) 122 may be disposed in a cell region CR of a second peripheral wafer PW2. In the present embodiment, each of page buffers included in the page buffer circuit 122 may be coupled in common to one of a plurality of first bit lines BL1 and one of a plurality of second bit lines BL2.

The page buffer circuit 122 may be disposed to have a shape extending in the first direction FD as a direction in which the first and second bit lines BL1 and BL2 are arranged, and may have a length in the first direction FD that is substantially the same as or similar to a first sub memory cell array 110A and a second sub memory cell array 110B.

Although not illustrated, a peripheral circuit (123 of FIG. 1) may be disposed in the first peripheral wafer PW1 and/or in the second peripheral wafer PW2. For example, the peripheral circuit may be disposed in a region where a first row decoder unit (X-DEC unit 1) 121A is not disposed in a first peripheral wafer PW1 and in a region where a second row decoder unit (X-DEC unit 2) 121B and the page buffer circuit (PB circuit) 122 are not disposed in the second peripheral wafer PW2.

The first row decoder unit (X-DEC unit 1) 121A may be disposed in the slimming region SR of the first peripheral wafer PW1. The first row decoder unit 121A and one part (not illustrated) of the peripheral circuit, which are disposed in the first peripheral wafer PW1, may configure a first logic circuit unit (120A of FIG. 2). The second row decoder unit (X-DEC unit 2) 121B may be disposed in the slimming region SR of the second peripheral wafer PW2. The second row decoder unit 121B, the page buffer circuit 122 and the other part (not illustrated) of the peripheral circuit, which are disposed in the second peripheral wafer PW2, may configure a second logic circuit unit (120B of FIG. 2).

Figure 6:
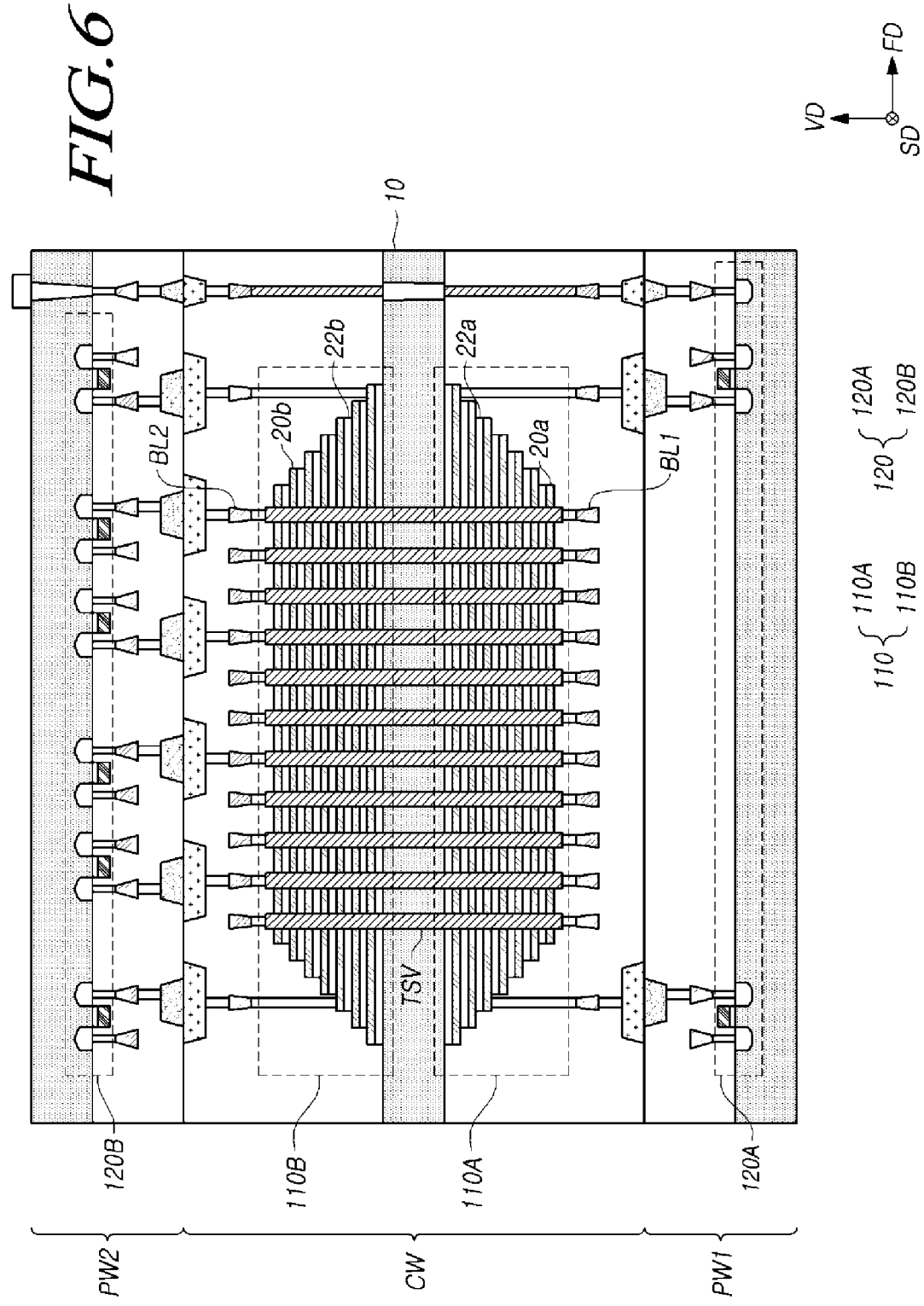
FIG. 6 is a cross-sectional view illustrating a representation of the semiconductor memory device illustrated in FIG. 5.

FIG. 6 is a cross-sectional view illustrating a representation of the semiconductor memory device illustrated in FIG. 5.

Referring to FIG. 6, as compared to the semiconductor memory device illustrated in FIGS. 3 and 4, a cell wafer CW may include a plurality of vertical wiring lines TSV, which couple the plurality of first bit lines BL1 and the plurality of second bit lines BL2. The plurality of first bit lines BL1 and the plurality of second bit lines BL2 may correspond, on a one-to-one basis, to each other. A first bit line BL1 and a second bit line BL2 that correspond to each other may be disposed to overlap with each other in the vertical direction VD. The vertical wiring lines TSV may extend in the vertical direction VD, and may couple the first bit lines BL1 and the second bit lines BL2 corresponding to each other.

For example, the vertical wiring lines TSV may pass through, in the vertical direction VD, a plurality of first electrode layers 20a, a plurality of first interlayer dielectric layers 22a, a source plate 10, a plurality of second electrode layers 20b and a plurality of second interlayer dielectric layers 22b. Although not illustrated, a dielectric layer that surrounds the outer sidewalls of the vertical wiring lines TSV may be formed to isolate the vertical wiring lines TSV from the plurality of first electrode layers 20a, the source plate 10 and the plurality of second electrode layers 20b.

According to the present embodiment, the first sub memory cell array 110A and the second sub memory cell array 110B share page buffers, so the number of page buffers and the occupation area of a page buffer circuit are reduced. Also, because a page buffer circuit is not disposed in the first peripheral wafer PW1, an area of the first peripheral wafer PW1, which may be utilized for disposing a peripheral circuit, may be increased.

Figure 7:
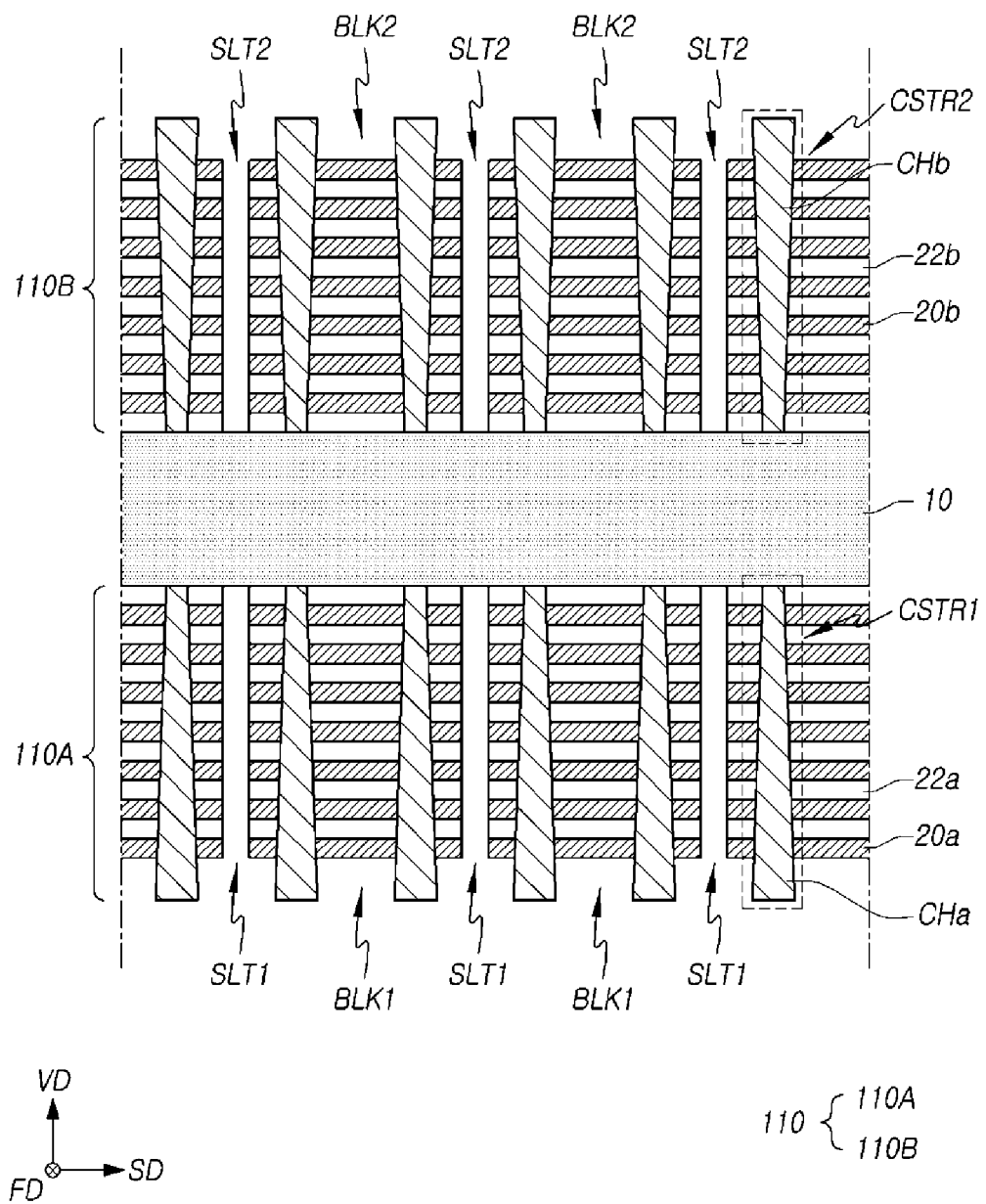
FIG. 7 is a cross-sectional view illustrating a representation of structures of a first sub memory cell array and a second sub memory cell array of a semiconductor memory device in accordance with an embodiment of the disclosure.

FIG. 7 is a cross-sectional view taken in the second direction SD, illustrating a representation of structures of a first sub memory cell array and a second sub memory cell array of a semiconductor memory device in accordance with an embodiment of the disclosure.

Referring to FIG. 7, a plurality of first slits SLT1, which divides alternately stacked first electrode layers 20a and first interlayer dielectric layers 22a, may be defined. Each of the plurality of first slits SLT1 may have a flat plate shape parallel or substantially parallel to a plane that is defined by the first direction FD and the vertical direction VD.

The plurality of first electrode layers 20a, the plurality of first interlayer dielectric layers 22a and a plurality of first vertical channels CHa disposed between a pair of adjacent first slits SLT1 may configure one first memory block BLK1. As the plurality of first slits SLT1 are arranged in the second direction SD, a plurality of first memory blocks BLK1 may be provided in the second direction SD.

Similarly, a plurality of second slits SLT2, which divides alternately stacked second electrode layers 20b and second interlayer dielectric layers 22b into units of memory blocks, may be defined, and thereby, a second sub memory cell array 110B may be divided into a plurality of second memory blocks BLK2.

During an erase operation, an erase voltage may be applied to a source plate 10. Using the first row decoder unit 121A and the second row decoder unit 121B illustrated in FIG. 1, an erase permission voltage may be applied to the word lines of a memory block selected from among the plurality of first memory blocks BLK1 and the plurality of second memory blocks BLK2, and an erase inhibition voltage having a level higher than the erase permission voltage may be applied to the word lines of the remaining unselected memory blocks. Therefore, the first memory block BLK1 included in the first sub memory cell array 110A and the second memory block BLK2 included in the second sub memory cell array 110B may be erased independently of each other.

In disclosed embodiments, by disposing the electrode layers 20a and 20b separately on the top and bottom surfaces of the source plate 10, the length of the vertical channels CHa and CHb may be reduced compared to a comparative example in which electrode layers are disposed on only one surface of the source plate 10. Accordingly, the number of memory cells included in a single cell string CSTR1 or CSTR2 may decrease, and the number of memory cells included in a single memory block BLK1 or BLK2 may decrease, thereby reducing the size of the memory blocks.

As is generally known in the art, a semiconductor memory device is configured by a plurality of memory blocks, and each memory block is configured by a plurality of pages. The semiconductor memory device performs write and read operations on a page basis, and performs an erase operation on a memory block basis. The speeds of the respective operations are different from one another. For example, the speed of the read operation is about 25 microseconds (μs), the speed of the write operation is about 250 μs and the speed of the erase operation is about 2,000 μs, and thus, the speeds of the respective operations are asymmetric. In particular, the speed of the erase operation is much slower than the speeds of the read operation and the write operation. The speed of the erase operation decreases as the size of a memory block increases. The slow erase operation is a major cause of degradation in the performance of semiconductor memory devices.

According to embodiments of the disclosure, by reducing the size of a memory block, the speed of an erase operation may be increased, thereby contributing to improvements in the performance of a semiconductor memory device.

Figure 8:
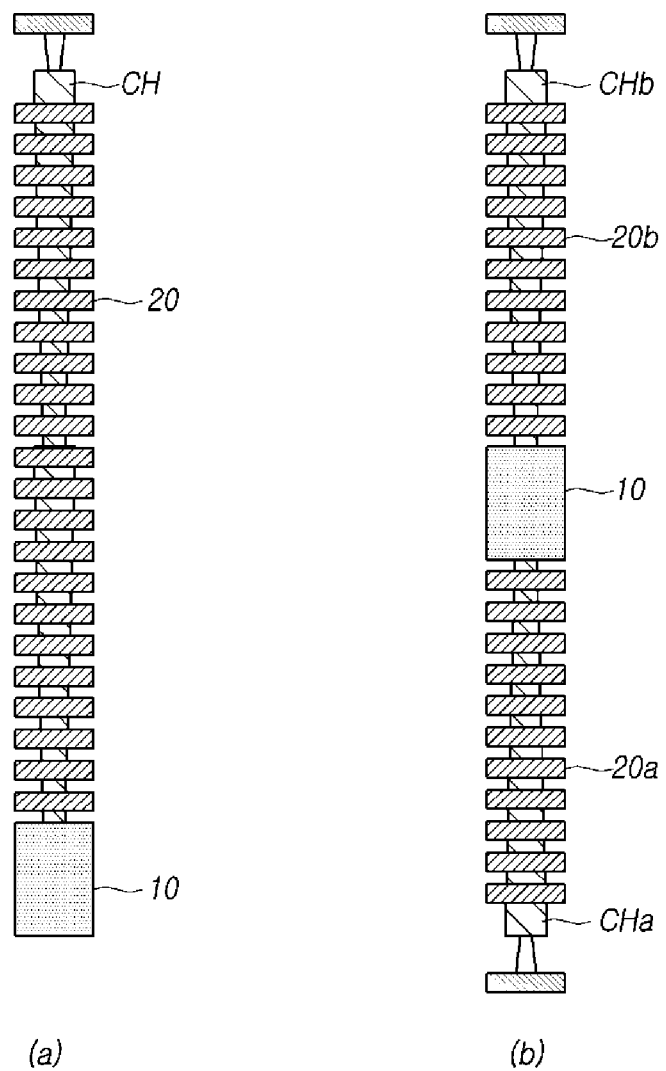
FIG. 8 is a representation of a view to assist in the comparison between a structure of a vertical channel related to the disclosure and a structure of a vertical channel according to embodiments of the disclosure.

FIG. 8 is a representation of a view to assist in the comparison of a structure of a vertical channel related to the disclosure and a structure of a vertical channel according to embodiments of the disclosure. Figure (a) of FIG. 8 illustrates a structure of a vertical channel related with the disclosure, and figure (b) of FIG. 8 illustrates a structure of a vertical channel according to the disclosure.

As illustrated in figure (a) of FIG. 8, in a comparative example in which all electrode layers 20 are stacked on only one surface of a source plate 10, a vertical channel CH has a relatively long length that passes through all the electrode layers 20. Due to this fact, as the magnitude of current reduced on the vertical channel CH increases, an amount of cell current may decrease and data sensing accuracy may degrade. Also, as the difference between a top CD (critical dimension) and a bottom CD of the vertical channel CH increases, threshold voltage dispersion of the electrode layers 20 may degrade.

The capacity of a pump circuit may be increased to compensate for current consumed on the vertical channel CH, and a tuning scheme for compensating for degradation in threshold voltage dispersion may be introduced. However, the size of a semiconductor memory device increases if the capacity of a pump circuit is increased, and a lot of time and effort are required to develop a tuning scheme.

As illustrated in figure (b) of FIG. 8, according to embodiments of the disclosure, electrode layers 20a and 20b are distributedly disposed on the top and bottom surfaces of a source plate 10, and a vertical channel CHa or CHb may be configured to have a relatively short length that passes through the electrode layers 20b stacked on the top surface of the source plate 10 or the electrode layers 20a stacked on the bottom surface of the source plate 10. Therefore, as the magnitude of current reduced on the vertical channels CHa and CHb decreases and thus an amount of cell current increases, data sensing accuracy may be improved. Moreover, because the difference between a top CD and a bottom CD of the vertical channels CHa and CHb is reduced, threshold voltage dispersion may be improved.

Figure 9:
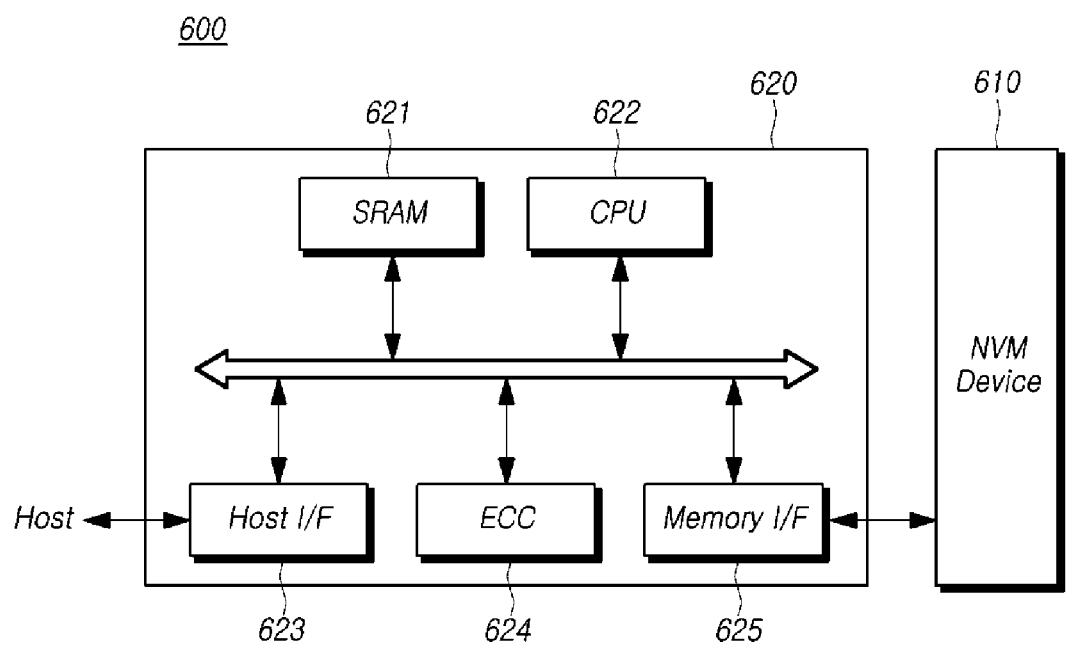
FIG. 9 is a block diagram schematically illustrating a memory system including a semiconductor memory device in accordance with embodiments of the disclosure.

FIG. 9 is a block diagram schematically illustrating a memory system including a memory device in accordance with embodiments of the disclosure.

Referring to FIG. 9, a memory system 600 in accordance with an embodiment may include a nonvolatile memory device (NVM Device) 610 and a memory controller 620.

The nonvolatile memory device 610 may be constituted by a memory device described above and may operate in the manner described above. The memory controller 620 may be configured to control the nonvolatile memory device (NVM Device) 610. The combination of the nonvolatile memory device (NVM Device) 610 and the memory controller 620 may be configured as a memory card or a solid state disk (SSD). An SRAM 621 is used as a working memory of a processing unit (CPU) 622. A host interface (Host I/F) 623 includes a data exchange protocol of a host which is coupled with the memory system 600.

An error correction code block (ECC) 624 detects and corrects an error included in data read from the nonvolatile memory device (NVM Device) 610.

A memory interface (MEMORY I/F) 625 interfaces with the nonvolatile memory device 610 of the present embodiment. The processing unit (CPU) 622 performs general control operations for data exchange of the memory controller 620.

Although not shown in the drawing, it is obvious to a person is skilled in the art to which the embodiment pertains that the memory system 600 in accordance with the embodiment may be additionally provided with a ROM which stores code data for interfacing with the host. The nonvolatile memory device (NVM Device) 610 may be provided as a multi-chip package which is constituted by a plurality of flash memory chips.

The memory system 600 in accordance with the embodiment, described above, may be provided as a storage medium of high reliability, which has a low probability of an error to occur. In particular, the nonvolatile memory device of the present embodiment may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Drive Electronics) protocol.

Figure 10:
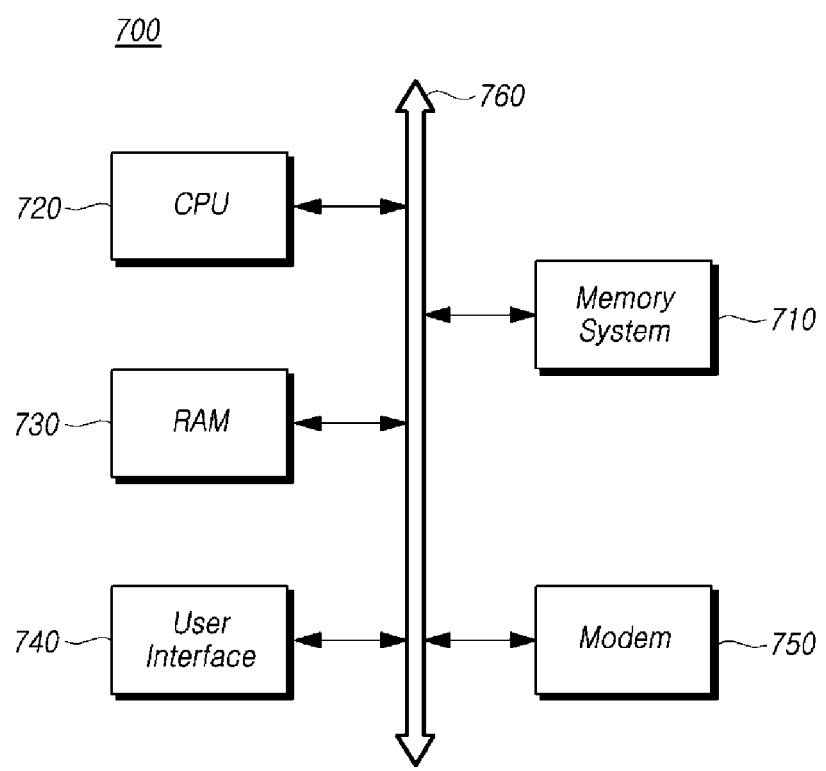
FIG. 10 is a block diagram schematically illustrating a computing system including a semiconductor memory device in accordance with an embodiment of the disclosure.

FIG. 10 is a block diagram schematically illustrating a computing system including a memory device in accordance with an embodiment of the disclosure.

Referring to FIG. 10, a computing system 700 in accordance with an embodiment may include a memory system 710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data.

Otherwise, the memory system 710 may be provided as a fusion flash memory (for example, an OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure may be interpreted in connection with the appended claims and encompass all equivalents falling within the scope of the appended claims.

What is claimed is:

1. A three-dimensional semiconductor memory device comprising:
   a cell wafer including a source plate, a plurality of first word lines stacked to be spaced apart from one another along a plurality of first vertical channels projecting from a bottom surface of the source plate in a vertical direction, a plurality of second word lines stacked to be spaced apart from one another along a plurality of second vertical channels projecting from a top surface of the source plate in the vertical direction, a plurality of first bit lines that are coupled to the plurality of first vertical channels, and a plurality of second bit lines that are coupled to the plurality of second vertical channels;
   a first peripheral wafer bonded to a bottom surface of the cell wafer, and including a first row decoder unit, which transfers an operating voltage to the plurality of first word lines;
   a second peripheral wafer bonded to a top surface of the cell wafer, and including a second row decoder unit, which transfers an operating voltage to the plurality of second word lines, and a page buffer circuit including a plurality of page buffers, wherein each of the plurality of page buffers is coupled in common to one of the plurality of first bit lines and one of the plurality of second bit lines; and
   a plurality of vertical contact structures coupled to the plurality of first bit lines, respectively, and passing through the plurality of first word lines, the source plate and the plurality of second word lines,
   wherein the plurality of first bit lines are coupled to the plurality of second bit lines, respectively, through the plurality of vertical contact structures.

2. The three-dimensional semiconductor memory device of claim 1,
   wherein
   the first peripheral wafer further includes a first page buffer circuit unit including a plurality of first page buffers, which are coupled to the plurality of first bit lines, and
   the second peripheral wafer further includes a second page buffer circuit unit including a plurality of second page buffers, which are coupled to the plurality of second bit lines.

3. The three-dimensional semiconductor memory device of claim 2, further comprising:
   a peripheral circuit,
   wherein the peripheral circuit is disposed in a region where the first row decoder unit and the first page buffer circuit unit are not disposed in the first peripheral wafer, and is disposed in a region where the second row decoder unit and the second page buffer circuit unit are not disposed in the second peripheral wafer.

4. The three-dimensional semiconductor memory device of claim 2, wherein structures in the cell wafer above the top surface of the source plate and structures in the cell wafer below the bottoms surface of the source plate are mirror images of each other.

5. The three-dimensional semiconductor memory device of claim 1, further comprising:
   a peripheral circuit,
   wherein the peripheral circuit is disposed in a region where the first row decoder unit is not disposed in the first peripheral wafer, and is disposed in a region where the second row decoder unit and the page buffer circuit are not disposed in the second peripheral wafer.

6. The three-dimensional semiconductor memory device of claim 1, wherein the cell wafer and the first and second peripheral wafers are each divided into a cell region and a slimming region SR, and the plurality of first word lines and the plurality of second word lines are disposed in the cell region, and the first row decoder unit and the second row decoder unit are disposed in the slimming region, and
   the cell region and the slimming region are arranged to minimize a delay of an operating voltage transferred from the first row decoder unit to the plurality of first word lines.

7. A three-dimensional semiconductor memory device comprising:
   a cell wafer including a source plate, a first memory block including a plurality of first cell strings, which extend in a vertical direction from a bottom surface of the source plate, a second memory block including a plurality of second cell strings, which extend in the vertical direction from a top surface of the source plate, a plurality of first bit lines that are coupled to the plurality of first cell strings, and a plurality of second bit lines that are coupled to the plurality of second cell strings;
   a first peripheral wafer bonded to a bottom surface of the cell wafer, and including a first row decoder unit, which transfers an operating voltage to the first memory block;
   a second peripheral wafer bonded to a top surface of the cell wafer, and including a second row decoder unit, which transfers an operating voltage to the second memory block, and a page buffer circuit including a plurality of page buffers, wherein each of the plurality of page buffers is coupled in common to one of the plurality of first bit lines and one of the plurality of second bit lines; and
   a plurality of vertical contact structures coupled to the plurality of first bit lines, respectively, and passing through the plurality of first word lines, the source plate and the plurality of second word lines,
   wherein the plurality of first bit lines are coupled to the plurality of second bit lines, respectively, through the plurality of vertical contact structures,
   wherein the first memory block and the second memory block are configured to be erased independently of each other.

8. The three-dimensional semiconductor memory device of claim 7,
   wherein
   the first peripheral wafer further includes a first page buffer circuit unit including a plurality of first page buffers, which are coupled to the plurality of first bit lines, and the second peripheral wafer further includes a second page buffer circuit unit including a plurality of second page buffers, which are coupled to the plurality of second bit lines.

9. The three-dimensional semiconductor memory device of claim 8, further comprising:
a peripheral circuit,
wherein the peripheral circuit is disposed in a region where the first row decoder unit and the first page buffer circuit unit are not disposed in the first peripheral wafer, and is disposed in a region where the second row decoder unit and the second page buffer circuit unit are not disposed in the second peripheral wafer.

10. The three-dimensional semiconductor memory device of claim 8, wherein structures in the cell wafer above the top surface of the source plate and structures in the cell wafer below the bottoms surface of the source plate are mirror images of each other.

11. The three-dimensional semiconductor memory device of claim 7, further comprising:
a peripheral circuit,
wherein the peripheral circuit is disposed in a region where the first row decoder unit is not disposed in the first peripheral wafer, and is disposed in a region where the second row decoder unit and the page buffer circuit are not disposed in the second peripheral wafer.

12. The three-dimensional semiconductor memory device of claim 7, wherein the cell wafer and the first and second peripheral wafers are each divided into a cell region and a slimming region SR, and the plurality of first cell strings and the plurality of second cell strings are disposed in the cell region, and the first row decoder unit and the second row decoder unit are disposed in the slimming region, and
the cell region and the slimming region are arranged to minimize a delay of an operating voltage transferred from the first row decoder unit to the plurality of first cell strings.

13. The three-dimensional semiconductor memory device of claim 7, wherein the first memory block is defined by a plurality of first slits extending in the vertical direction from the bottom surface of the source plate, and the second memory block is defined by a plurality of second slits extending in the vertical direction from the top surface of the source plate.

14. A three-dimensional semiconductor memory device comprising:
a cell wafer including a source plate, a first sub memory cell array that is disposed under the source plate, and a second sub memory cell array that is disposed on the source plate;
a first peripheral wafer bonded to a bottom surface of the cell wafer, and including a first logic circuit unit, which transfers an operating voltage to the first sub memory cell array; and
a second peripheral wafer bonded to a top surface of the cell wafer, and including a second logic circuit unit, which transfers an operating voltage to the second sub memory cell array,
wherein cell wafer and first and second peripheral wafers are each divided into a cell region and a slimming region SR, and the first sub memory cell array and the second sub memory cell array are disposed in the cell region, and the first logic circuit unit and the second logic circuit unit are disposed in the slimming region, and
the cell region and the slimming region are arranged to minimize a delay of an operating voltage provided from the first logic circuit unit to the first sub memory cell array.

15. The three-dimensional semiconductor memory device of claim 14, further comprising:
a plurality of external coupling pads coupled to the first logic circuit unit and the second logic circuit unit, and configured to interface with an external device.

* * * * *